United States Patent [19]
Takata et al.

[11] Patent Number: 5,526,214
[45] Date of Patent: Jun. 11, 1996

[54] SHORT-CIRCUIT PROTECTIVE CIRCUIT AND POWER DARLINGTON TRANSISTOR MODULE

[75] Inventors: Ikunori Takata; Masanori Inoue, both of Fukuoka, Japan

[73] Assignee: Mitsubishi Denki Kabushiki Kaisha, Tokyo, Japan

[21] Appl. No.: 127,609

[22] Filed: Sep. 28, 1993

[30] Foreign Application Priority Data

Oct. 1, 1992 [JP] Japan .................................. 4-263316
Sep. 8, 1993 [JP] Japan .................................. 5-223391

[51] Int. Cl.⁶ ............................... H02H 7/20; H02H 9/04
[52] U.S. Cl. ............................... 361/56; 361/58; 330/298
[58] Field of Search ............................... 361/54, 56, 18, 361/58; 323/278; 330/298

[56] References Cited

U.S. PATENT DOCUMENTS 4,374,364  2/1983  Hemery et al. .................. 330/298
5,206,605  4/1993  Brannan et al. .................. 330/252

FOREIGN PATENT DOCUMENTS

56-100509  8/1981  Japan .
59-194457  11/1984  Japan .
60-237707  11/1985  Japan .

*Primary Examiner*—A. D. Pellinen
*Assistant Examiner*—Michael J. Sherry
*Attorney, Agent, or Firm*—Oblon, Spivak, McClelland, Maier & Neustadt

[57] ABSTRACT

The present invention is directed to effectively prevent "load short-circuit breakdown" of a power Darlington transistor. When a potential different between a base BX and emitter E at a final stage of a power Darlington transistor (20) is at a specified level of voltage determined by base-emitter forward voltage of a protective bipolar transistor (32), the protective bipolar transistor (32) turns on, and accordingly, base current $I_B$ at an initial stage of the power Darlington transistor (20) is bypassed to the emitter E at the final stage. Hence, excessive rising of collector current $I_C$ of the Darlington transistor (20) is suppressed, and "load short-circuit breakdown" is prevented. The potential difference does not depend upon the number of stages of the Darlington transistor nor temperature, and therefore, it is facilitated for Darlington transistors of various numbers of stages to design a short-circuit protective circuit to ensure a specified bypass operation in the whole range of working temperature.

1 Claim, 9 Drawing Sheets

SHORT-CIRCUIT PROTECTIVE CIRCUIT AND POWER DARLINGTON TRANSISTOR MODULE

BACKGROUND OF THE INVENTION

1. Field of the Invention

The present invention relates to a short-circuit protective circuit for protecting a power Darlington transistor in case where a load is short-circuited, and to a power Darlington transistor module containing the short-circuit protective circuit therein.

2. Prior Art

In a power circuit device like a power Darlington transistor, operating conditions on the power circuit device when a load therein is short-circuited, that is, voltage and current, are ones of the most significant factors which affect a determination on whether the power circuit device can be used. Especially, when a load is short-circuited in a power transistor utilized for an inverter, current 4 to 10 times as much as rated current flows in the transistor under the condition that supply voltage is applied thereto. Power applied to the transistor is approximately 1000 times as large as rated power demand. Thus, if this short-circuiting state is retained, the transistor is at last broken. This phenomenon is named "load short-circuit breakdown", which is generally one of the most important factors whether a transistor can be adapted or not.

In practice, the power transistor is required to sustain a state where a load is short-circuiting (load short-circuiting state) lasting for at least 10–20 μsec or more. For this period of time a drive circuit for the transistor can detect and control an abnormal increase in current flowing in the load so as to break a transistor circuit, and hence, the breakdown of the transistor can be avoided.

Figure 8A:
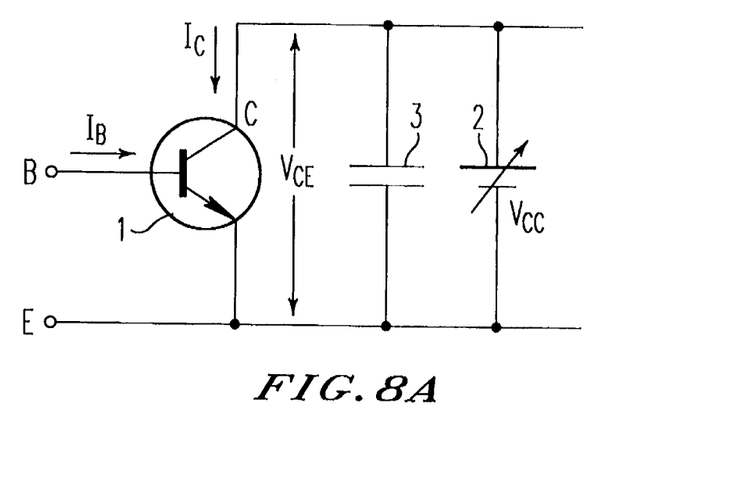
FIG. 8 is a circuit diagram showing a test circuit on the load short-circuit breakdown.
Figure 8B:
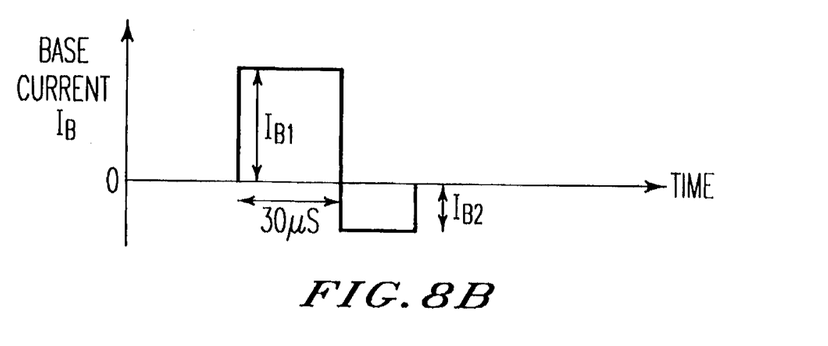

FIG. 8 depicts a circuit (a test circuit) for a test about the "load short-circuit breakdown". In this test circuit, a power source 2 and a capacitor 3 are connected in parallel to a collector C and emitter E of a transistor 1 or a measured object. It is important that the wiring connecting the transistor 1, the power source 2 and the capacitor 3 to one another must be as short as possible. Upon the test, supply voltage $V_{cc}$ is set to a certain level, and base current $I_B$ of the transistor 1 is supplied in a single pulse having a width of 30 μsec to turn on the transistor 1 for an instant. Then, the maximum value of collector current $I_C$ and collector-emitter voltage $V_{CE}$ at that instant are measured.

Figure 9:
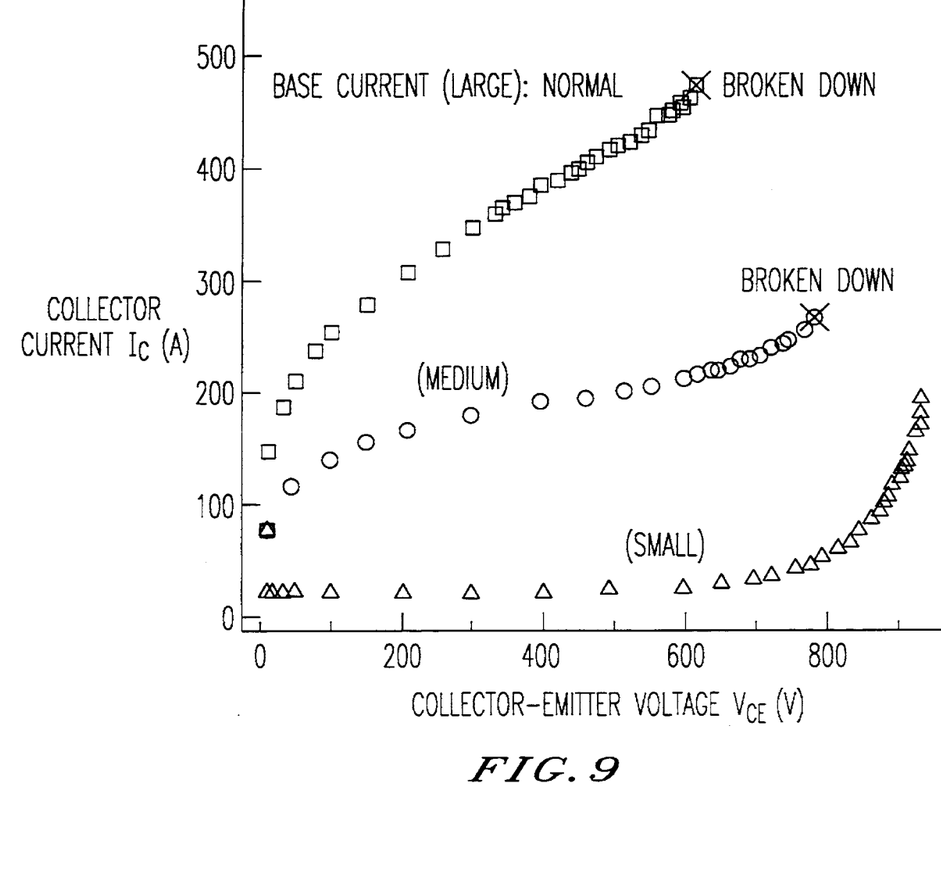
FIG. 9 is a graph showing results of a test on the load short-circuit breakdown.

FIG. 9 is a graph showing results of a test where the test circuit shown in FIG. 8 is used to conduct a measurement to a measured sample of the prior art transistor 1 without a protective circuit. For three sorts of the base current $I_B$, respective maximum values of the collector current $I_C$ are measured while the supply voltage $V_{cc}$ is raised stepwise till the transistor 1 is broken down. The vertical axis of FIG. 9 represents the maximum value of the collector current $I_C$ in such a condition. Symbol X in FIG. 9 represents a point where the transistor 1 is broken down. As can be seen in FIG. 9, it is apparent that as the base current $I_B$ becomes smaller, the collector current $I_C$ becomes smaller related to the same collector-emitter voltage $V_{CE}$, and consequently, the level of the collector-emitter voltage $V_{CE}$ where the transistor 1 is broken down (breakdown voltage) becomes higher.

The "load short-circuit breakdown" of the transistor is classified into two sorts; a first breakdown mode (thermal breakdown mode) caused by temperature rising in a semiconductor chip containing transistors, and a second breakdown mode (power breakdown mode) in which the transistor is broken down at the instant when electric power applied to the transistor reaches a specified level (see Document 1: H. Nishiumi et al., "High Voltage High Power Transistor Modules for 440 V AC Line Voltage Inverter Applications", in Conference Record of IPEC-Tokyo 83, pp. 297–305, 1983). With the test circuit shown in FIG. 8, since power is applied to the transistor 1 for a very short period of about 30 μsec, the breakdown point shown in FIG. 9 is equivalent to the power breakdown mode.

Figure 10:
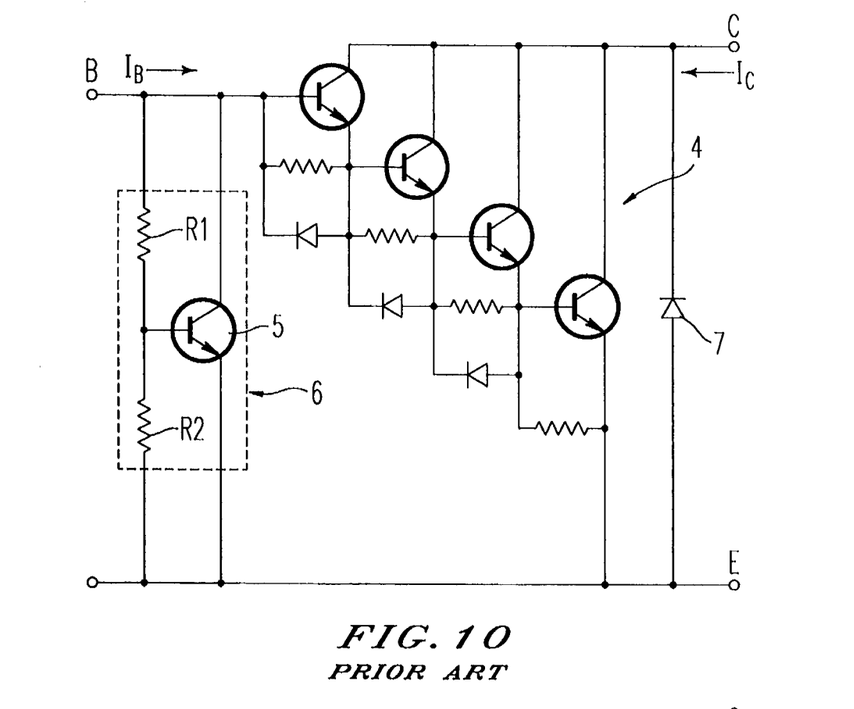
FIG. 10 is a circuit diagram showing a first prior art embodiment.
Figure 11:
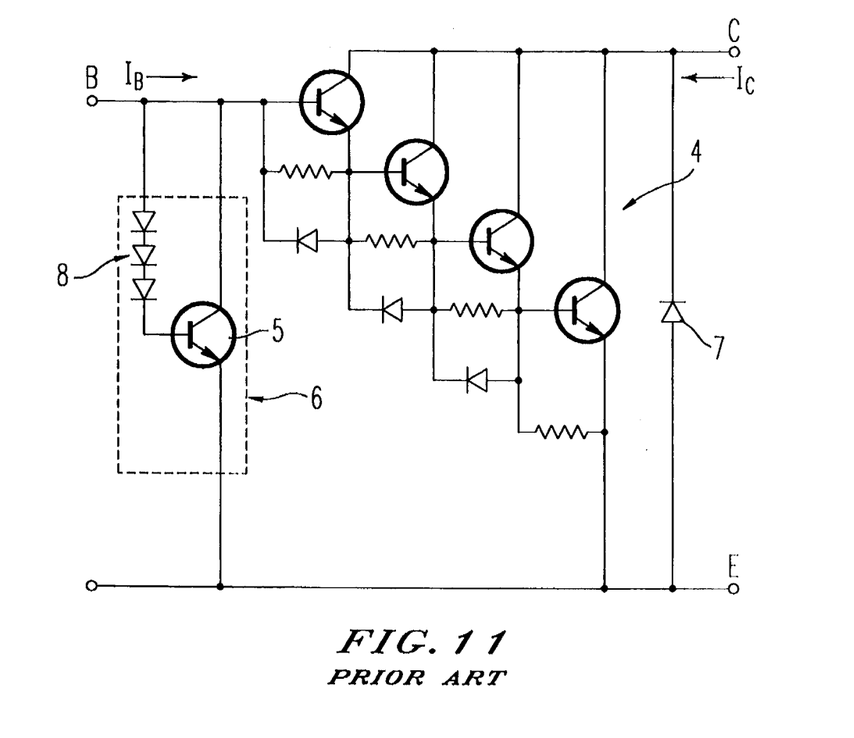
FIG. 11 is a circuit diagram showing a second prior art embodiment.
Figure 12:
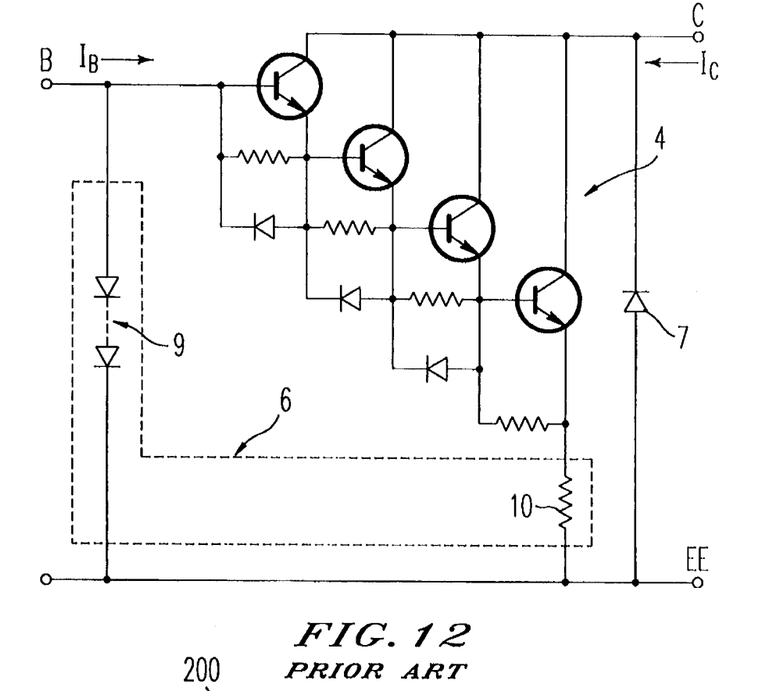
FIG. 12 is a circuit diagram showing a third prior art embodiment.

A method of improving sustainability against breakdown in the power breakdown mode (breakdown sustainability) under the condition of "load short-circuiting state" is, as will be recognized in the above results of the test, basically restricting the collector current $I_C$ so as not to cause a excessively large flow of the collector current $I_C$, and for that purpose, the base current $I_B$ may be reduced in load short-circuiting. An exemplary method for that utilizes a general characteristic of the transistor that base-emitter forward voltage $V_{BE}$ rises as the collector current $I_C$ is increased. Specifically, a reference voltage circuit preset appropriately is provided to make a comparison between reference voltage supplied by this circuit and the base-emitter forward voltage $V_{BE}$ of the transistor. If the base emitter forward voltage $V_{BE}$ is higher, the base current $I_B$ of the transistor is reduced to properly control the excessive flow of the collector current $I_C$. FIGS. 10 to 12 depict three types of embodiments based upon this method.

<First Prior Art Embodiment>

As to an exemplary circuit shown in FIG. 10, a short-circuit protective circuit 6 comprised of a transistor 5 and voltage dividing resistances R1 and R2 for retaining voltage at a specified level or below is provided between a base (initial stage base) B and emitter (final stage emitter) E of a Darlington transistor 4. A free wheel diode 7 is connected in parallel with the Darlington transistor between its collector C and emitter E. In a situation as in the "load short-circuit" where collector current $I_C$ (primary current) several times as much as the rated current flows, however, base-emitter forward voltage of the Darlington transistor 4 rises. When voltage obtained by dividing the base-emitter forward voltage by the voltage dividing resistances R1 and R2 reaches base-emitter forward voltage of the transistor 5, base current $I_B$ of the Darlington transistor 4 is bypassed to the transistor 5, and the base current $I_B$ supplied to the Darlington transistor 4 is suppressed. Consequently, excessive rising of the collector current $I_C$ of the Darlington transistor 4 can be suppressed.

<Second Prior Art Embodiment>

In a prior art embodiment shown in FIG. 11, the voltage dividing resistances R1 and R2 in FIG. 10 are replaced with a diode 8 connected between a base of the transistor 5 and a base B of the Darlington transistor 4. The short-circuit protective circuit 6 functions so that the base-emitter forward voltage of the Darlington transistor 4 is not more than the total of the sum of forward threshold voltage of the diode 8 and the base-emitter forward voltage of the transistor 5. Instead of the diode 8 connected in a forward direction, a Zener diode connected in the reverse direction may be used for the similar feature. The diode 8 may be replaced with a circuit having a forward diode and a reverse Zener diode connected in series to obtain the similar feature.

<Third Prior Art Embodiment>

In a prior art embodiment shown in FIG. 12, a resistance 10 is connected between an emitter E of the Darlington transistor 4 and an output terminal EE close to the emitter, and a diode 9 is connected in parallel with the Darlington transistor 4 between a base B of the Darlington transistor 4 and the output terminal EE. As collector current $I_C$ of the Darlington transistor 4 increases and its base-emitter forward voltage becomes higher than the sum of forward threshold voltage of the diode 9, base current $I_B$ of the Darlington transistor 4 is bypassed to the diode 9. Although it is generally difficult to adequately regulate the forward threshold voltage of the diode 9, voltages at opposite terminals of the resistance 10 increase in proportion to an increase in the collector current $I_C$ of the Darlington transistor 4, and hence, in this prior art embodiment, there can be a wide choice of levels of the forward threshold voltage of the diode 9. Also in this prior art embodiment, the diode 9 connected in a forward direction may be replaced with a Zener diode connected in the reverse direction, and additionally, it may be replaced with a serial circuit of a forward diode and a reverse Zener diode.

However, the above prior art technology has disadvantages as mentioned below.

<Disadvantage in the First Prior Art Embodiment>

In the first prior art embodiment, it is necessary to set levels of the voltage dividing resistances R1 and R2 considerably low so that base current corresponding to a current amplification factor hFE of the transistor 5 can be sufficiently supplied to the transistor 5. When the levels of the voltage dividing resistances R1 and R2 are low, the base current $I_B$ must be raised in the circuit shown in FIG. 10, and a great amount of power is required to drive the circuit. Thus, there arises the problem that a driving device (omitted in the drawing) for driving the circuit is costly.

When the prior art exemplary circuit is applied to an inverter, for example, feedback current flows in a free wheel diode 7 for a while. For this period reverse bias voltage is applied between the base B and emitter E of the Darlington transistor 4 to turn off the Darlington transistor 4, and this allows the transistor 5 to work as a reversely connected transistor; that is, base current of the transistor 5 is supplied through the voltage dividing resistance R2, and current flows in a course from an emitter of the transistor 5 via a collector of the transistor 5 and the base B of the Darlington transistor 4 to the collector C of the Darlington transistor 4. Although the current is minuter than the primary current $I_C$, there is a problem that the current easily causes the breakdown of the Darlington transistor 4 in an inverter which performs switching at high speed. This is because the Darlington transistor 4 is put in a situation where supply voltage is quickly applied thereto just after the period when the feedback current flows in the free wheel diode 7, and even with a slight electric charge remaining in a device in this situation, current equivalent to the multiple of the electric charge flows in the Darlington transistor 4 (see Appended Document 1).

<Disadvantage of the Second Prior Art Embodiment>

The second prior art embodiment has a disadvantage that it is difficult to select an appropriate level of the sum of the forward threshold voltage of the diode 8. Moreover, selection of the level is difficult the more because it must be performed corresponding to a temperature range from the ambient temperature to 125° C., or a temperature range in which a device is operative. There also arises a problem that the diode 8 must be selected for each of Darlington transistors of various numbers of stages. Furthermore, there is another disadvantage that oscillation is easily caused because of a high impedance of the base of the transistor 5. To avoid this, a resistance is generally connected between the base and emitter of the transistor 5. However, this causes residual electric charge as in the first prior embodiment, and thus, there is another disadvantage that this prior art exemplary circuit cannot be applied to an inverter.

<Disadvantage of the Third Prior Art Embodiment>

In the third prior art embodiment, there is a disadvantage that it is not easy to set the forward threshold voltage of the diode 9 to an appropriate level in the above-mentioned working temperature range although its adjustment is relatively easy because a resistance 10 is provided. There also arises a disadvantage that the resistance 10 causes an extra power loss because the primary current $I_C$ flows in the resistance 10.

SUMMARY OF THE INVENTION

According to the present invention, a short-circuit protective circuit for protecting a power Darlington transistor having a plurality of transistors arranged in stages in case where a load is short-circuited comprises (a) a discharge path connecting a base at an initial stage of the Darlington transistor and an emitter at its final stage so as to electrically connecting the base and emitter; and (b) control means provided in the discharge path for substantially putting the discharge path in a conductive state when a potential difference between the base and emitter at the final stage of the Darlington transistor is at a specified level or over.

According to the present invention, making reference to a potential difference between a base and emitter at a final stage of a power Darlington transistor, base current of an initial stage of the Darlington transistor is bypassed to the emitter at the final stage when the potential difference reaches a specified level or over, and hence, excessive rising of the collector current of the Darlington transistor is effectively suppressed and "load short-circuit breakdown" is prevented. The potential difference does not depend upon the number of stages of the Darlington transistor nor temperature, and therefore, it is effectively facilitated for Darlington transistors of various numbers of stages to design the short-circuit protective circuit to ensure a specified bypass operation in the whole range of working temperature.

Preferably, the control means includes (b-1) a protective bipolar transistor provided in the discharge path and having its collector connected to the base at the initial stage of the Darlington transistor, its emitter connected to the emitter at the final stage of the Darlington transistor, and its base connected to a base at the final stage of the Darlington transistor; and (b-2) a diode provided in the discharge path in such a directional arrangement that its forward current is forward collector current of the protective bipolar transistor.

When a potential difference between a base and emitter at a final stage of a power Darlington transistor is at a specified voltage level or over determined by base-emitter forward voltage of the protective bipolar transistor, the protective bipolar transistor turns on and base current of an initial stage of the Darlington transistor is bypassed to the emitter at the final stage. Hence, excessive rising of collector current of the Darlington transistor is effectively suppressed, and "load short-circuit breakdown" is prevented. Also, since the potential difference does not depend upon the number of stages of the Darlington transistor nor temperature, it is effectively facilitated for Darlington transistors of various numbers of stages to design the short-circuit protective circuit to ensure a specified bypass operation in the whole range of working temperature. In addition to that, since a diode is arranged in series to the protective bipolar transistor so as not to cause residual electric charge, a circuit design can be effectively applied to an inverter because there is no possibility of the breakdown of the Darlington transistor. Also, without generation of the residual electric charge, an impedance of the base of the protective bipolar transistor is lowered so as not to easily cause oscillation therein. Moreover, since no resistance is provided between the base at the initial stage of the Darlington transistor and an emitter at its final stage, power required to drive the Darlington transistor can be reduced, and a drive circuit can be obtained at a reduced cost. Furthermore, since it is needless providing a resistance in a path of primary current of the Darlington transistor, there is no extra power loss.

Preferably, the diode includes (b-2-1) a Schottky barrier diode provided in the discharge path in such a directional arrangement that its forward current is the forward collector current of the protective bipolar transistor.

Preferably, the control means further includes (b-3) a resistance connected between the base of the protective bipolar transistor and the emitter at the final stage of the Darlington transistor.

Preferably, the control means includes (b-1) a protective MOSFET provided in the discharge path and having its drain connected to abase at an initial stage of the Darlington transistor, its source connected to the emitter at the final stage of the Darlington transistor, and its gate connected to abase at the final stage of the Darlington transistor; and (b-2) a diode provided in the discharge path in such a directional arrangement that its forward current is forward drain current of the protective MOSFET.

When a potential difference between a base and emitter at a final stage of a power Darlington transistor reaches at a specified voltage level or over determined by gate-source threshold voltage of a protective MOSFET, the protective MOSFET turns on, and accordingly base current of an initial stage of the Darlington transistor is bypassed to the emitter at its final stage. Hence, excessive rising of collector current of the Darlington transistor is effectively suppressed, and "lead short-circuit breakdown" is prevented. Since the potential difference does not depend upon the number of stages of the Darlington transistor nor temperature, it is effectively facilitated for Darlington transistors of various numbers of stages to design a short-circuit protective circuit to ensure a specified bypass operation in the whole range of working temperature. Moreover, since a diode is arranged in series to the protective MOSFET so as not to cause residual electric charge, a circuit design can be applied to an inverter because there is no possibility of breaking down the Darlington transistor. In addition to that, without causing the residual electric charge, an impedance of a gate of the protective MOSFET is reduced so as not to easily cause oscillation. Furthermore, since no resistance is provided between a base at an initial stage of the Darlington transistor and the emitter of its final stage, power required to drive the Darlington transistor can be reduced, and a drive circuit can be obtained at a reduced cost. Moreover, it is needless providing a resistance in a path of primary current of the Darlington transistor, and therefore, there is no extra power loss.

Preferably, the diode includes (b-2-1) a Schottky barrier diode provided in the discharge path in such a directional arrangement that its forward current is the forward drain current of the MOSFET.

Preferably, the control means further includes (b-3) a resistance connected between the gate of the protective MOSFET and the emitter at the final stage of the Darlington transistor.

Preferably, the control means includes (b-1) impedance transforming means provided in the discharge path for controlling an impedance of the discharge path; (b-2) reference voltage generating means for supplying a specified level of reference voltage; (b-3) comparing means for comparing a potential difference between the base and emitter at the final stage of the Darlington transistor with the reference voltage supplied by the reference voltage generating means to instruct the impedance transforming means to reduce the impedance when the potential difference is higher than the reference voltage.

A potential difference between a base and emitter at a final stage of a power Darlington transistor is compared with reference voltage, and an impedance between a base at an initial stage of the Darlington transistor and the emitter at its final stage is reduced when the potential difference is higher than the reference voltage. Hence, since base current of the initial stage of the Darlington transistor is bypassed to the emitter of its final stage, excessive rising of collector current of the Darlington transistor is suppressed and "load short-circuit breakdown" is prevented. Also, since the potential difference does not depend upon the number of stages of the Darlington transistor nor temperature, it is effectively facilitated for Darlington transistors of various numbers of stages to design a short-circuit protective circuit to ensure a specified bypass operation in the whole range of working temperature.

The present invention is also directed to a power Darlington transistor module which comprises (a) a power Darlington transistor having a plurality of transistors arranged in stages; (b) a discharge path connecting a base at an initial stage of the Darlington transistor and an emitter at its final stage to electrically connect the base and emitter; (c) control means provided in the discharge means so as to substantially put the discharge path in a conductive state when a potential difference between a base and emitter at the final stage of the Darlington transistor is at a specified level or higher.

Preferably, the control means includes (c-1) a protective bipolar transistor provided in the discharge path and having its collector connected to a base at the initial stage of the Darlington transistor, its emitter connected to the emitter at the final stage of the Darlington transistor, and its base connected to a base at the final stage of the Darlington transistor; and (c-2) a diode provided in the discharge path in such a directional arrangement that its forward current is forward collector current of the protective bipolar transistor.

Preferably, the diode includes (c-2-1) a Schottky barrier diode provided in the discharge path in such a directional arrangement that its forward current is forward collector current of the protective bipolar transistor.

Preferably, the control means further includes (c-3) a resistance connected between the base of the protective bipolar transistor and the emitter at the final stage of the Darlington transistor.

Preferably, the control means includes (c-1) a protective MOSFET provided in the discharge path and having its drain connected to the base at the initial stage of the Darlington transistor, its source connected to the emitter at the final stage of the Darlington transistor, and its gate connected to the base at the final stage of the Darlington transistor; and (c-2) a diode provided in the discharge path in such a directional arrangement that its forward current is forward drain current of the protective MOSFET.

Preferably, the diode includes (c-2-1) a Schottky barrier diode provided in the discharge path in such a directional arrangement that its forward current is the forward drain current of the protective MOSFET.

Preferably, the control means further includes (c-3) a resistance connected between the gate of the protective MOSFET and the emitter at the final stage of the Darlington transistor.

Preferably, the control means includes (c-1) impedance transforming means provided in the discharge path for controlling an impedance of the discharge path; (c-2) reference voltage developing means for supplying a specified level of reference voltage; and (c-3) comparing means for comparing a potential difference between the base and emitter at the final stage of the Darlington transistor with the reference voltage supplied by the reference voltage generating means to instruct the impedance transforming means to reduce the impedance when the potential difference is higher than the reference voltage.

Preferably, the power Darlington transistor is integrated as one chip.

Since a power Darlington transistor is integrated as one chip, the module have uniform characteristics and an enhanced reliability and can be fabricated in an easy manner.

Accordingly, it is an object of the present invention to provide a short-circuit protective circuit which is capable of reducing power required to drive a Darlington transistor, applicable to an inverter without breaking the Darlington transistor down, capable of facilitating a specified operation in the whole range of working temperature, needless to select a device for each of Darlington transistors of various numbers of stages, not easily permitting oscillation phenomenon, leading to no extra power loss, and preventing "load short-circuit breakdown" of a power Darlington transistor, and to provide a power Darlington transistor module containing the short-circuit protective circuit.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

[1. Characteristics of Darlington transistor]
<Measured Data>

Figure 2:
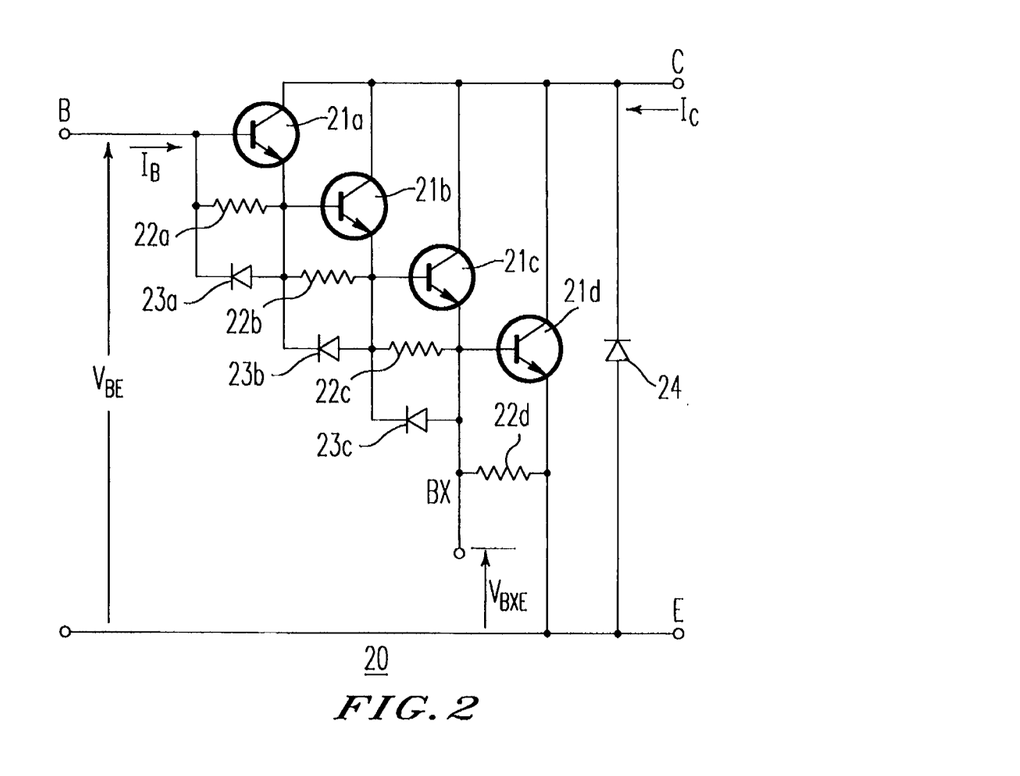
FIG. 2 is a circuit diagram showing an exemplary power Darlington transistor.

FIG. 2 is a circuit diagram showing an exemplary power Darlington transistor having rated voltage and rated current of 1200 V and 75 A, respectively. The Darlington transistor 20 has four transistors 21a to 21d arranged in four stages. In response to base current of the transistor 21a at an initial stage, or base current $I_B$ of the Darlington transistor 20, collector current $I_C$ flows. Primarily the transistor 21d at a final stage of the Darlington transistor shares in the collector current $I_C$ as its collector current with other transistors.

Resistances 22a to 22d are connected between a base and emitter of each of the transistors 21a to 21d, respectively, to prevent oscillation. Speed-up diodes 23a to 23c are respectively connected between bases and emitters of the transistors 21a to 21c to achieve quick turning off of the transistor module. A free wheel diode 24 for bypassing feedback current is connected between a collector C and emitter E of the Darlington transistor 20, or between the collector and emitter of the transistor 21d at the final stage, to prevent feedback current from breaking the Darlington transistor 20 down.

Figure 3:
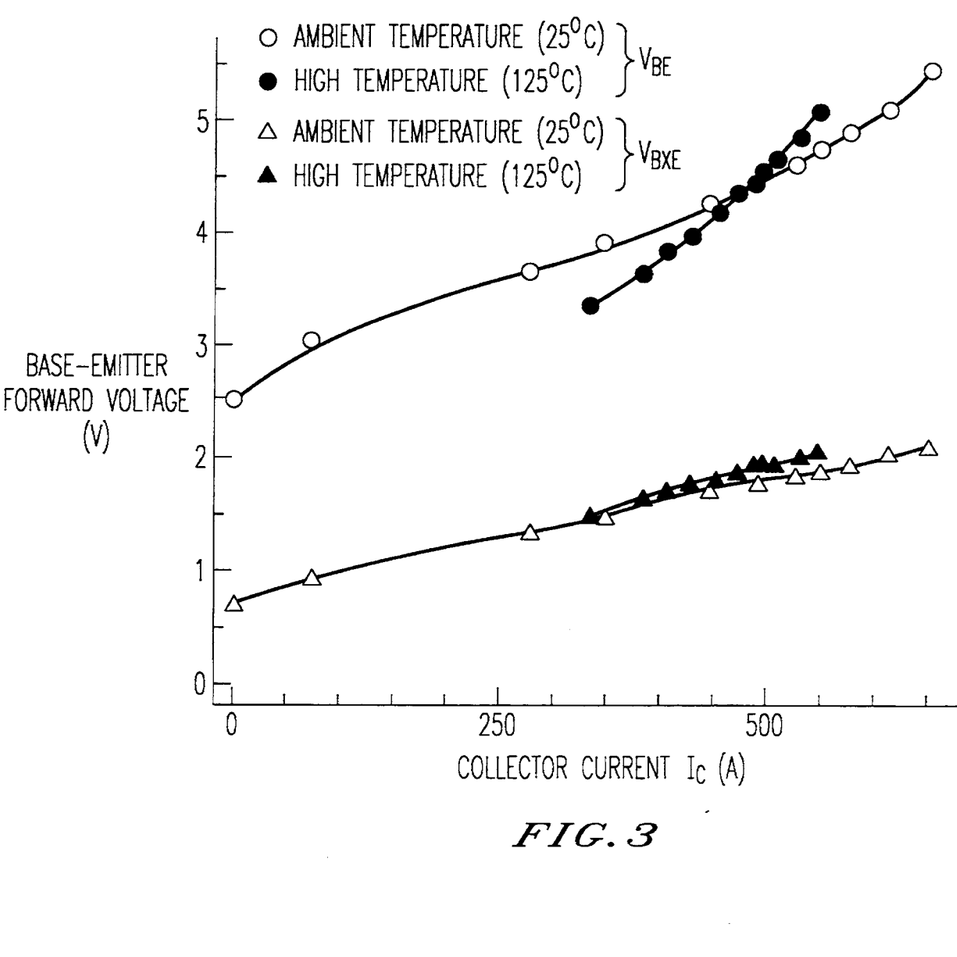
FIG. 3 is a graph showing data of practical measurement related to a property of the Darlington transistor.

FIG. 3 is a graph showing data obtained by conducting a measurement about a characteristic of the Darlington transistor 20 shown in a circuit diagram of FIG. 2. In practice, measured are the collector current $I_C$, base-emitter forward voltage $V_{BE}$ and base-emitter forward voltage $V_{BXE}$ of the transistor 21d at the final stage under the condition that the base-current $I_B$ is being varied stepwise at two different temperature levels. Throughout the measurement, collector-emitter voltage $V_{CE}$ is set to 400 V. In FIG. 3, circles represent data measured on the base-emitter forward voltage $V_{BE}$ and triangles represent data measured on the base-emitter forward voltage $V_{BXE}$; furthermore, blank ones of the circles and triangles represent data measured at the ambient temperature (25° C.) and solid ones of them represent data measured under high temperature (125° C.)

FIG. 3 expresses that there are clear correlations between the collector current $I_C$ of the Darlington transistor 20 and its base-emitter forward voltage $V_{BE}$ and between the collector current $I_C$ and the base-emitter forward voltage $V_{BXE}$. As can be seen, as the collector current $I_C$ increases, both the base-emitter forward voltage $V_{BE}$ and the base-emitter forward voltage $V_{BXE}$ rise. FIG. 3 also shows an important fact that the relation between the collector current $I_C$ and the base-emitter forward voltage $V_{BE}$ highly depends upon temperature while the relation between the collector current $I_C$ and the base-emitter forward voltage $V_{BXE}$ almost does not.

In general, forward threshold voltage of a diode, Zener voltage of a Zener diode, and base-emitter forward voltage of a transistor have their respective temperature dependencies. Also, since a location where the short-circuit protective circuit is provided is generally different from a location where a Darlington transistor is provided, the relation between the temperature in the short-circuit protective circuit and the temperature in the Darlington transistor is complicated. As to the technologies in the above mentioned first to third prior art embodiments, it is difficult to select the voltage dividing resistances R1 and R2 and the diodes 8 and 9 so as to adjust the base-emitter forward voltage $V_{BE}$ of the Darlington transistor in the whole range of working temperature.

<Basic Characteristic of the Present Invention>

Meanwhile, in the technology of the present invention, the collector current $I_C$ is adjusted based upon the base-emitter forward voltage $V_{BXE}$ of the transistor 21d at the final stage. Thus, the technology of the present invention is designed so that the collector current $I_C$, in the whole range of working temperature can be adjusted appropriately and easily.

The base-emitter forward voltage $V_{BE}$ varies a great deal as the number of stages of the Darlington transistor varies. Thus, the above-mentioned prior art technology has a disadvantage that a device suitable to the short-circuit protective circuit must be selected for each of products different in the number of stages. In the technology of the present invention, however, the suitable device is selected independent of the number of stages of the Darlington transistor because the collector current $I_C$ is adjusted by making reference to the base-emitter forward voltage $V_{BXE}$ of the transistor at the final stage. As a result, in accordance with the present invention, a design and manufacturing process of the short-circuit protective circuit can be considerably simplified, and accordingly, a design cost and manufacturing cost can be reduced.

[2. First Embodiment]

<Circuit Architecture>

Figure 1:
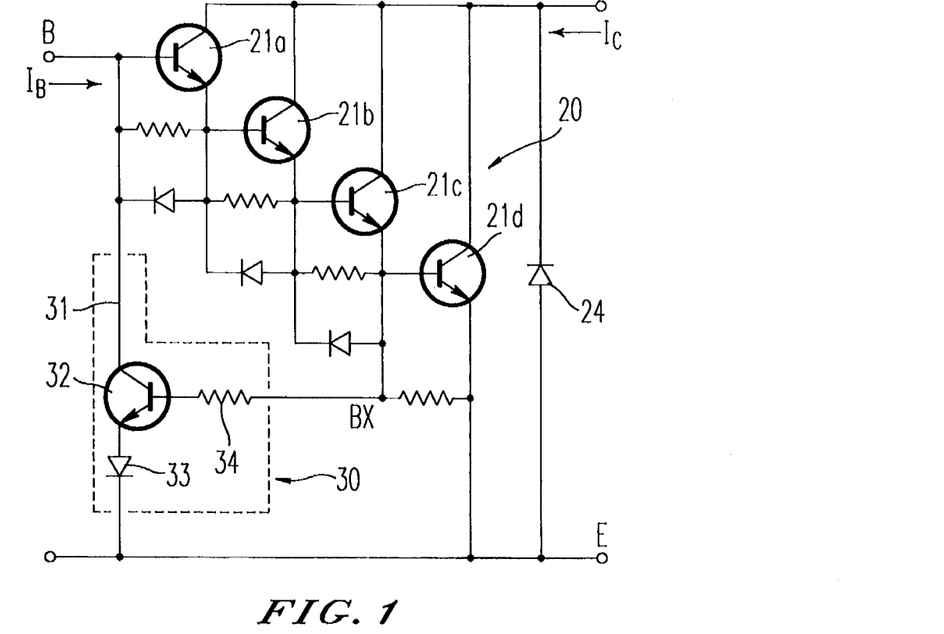
FIG. 1 is a circuit diagram showing a first preferred embodiment of the present invention.

FIG. 1 is a circuit diagram showing a first preferred embodiment of the present invention. This embodiment is a power Darlington transistor module where a short-circuit protective circuit 30 is incorporated in a Darlington transistor 20 as shown in FIG. 2. The short-circuit protective circuit 30 is provided with a discharge path 31 connecting abase B and emitter E of the Darlington transistor 20 in an electrically conductive stage, with a protective bipolar transistor 32 and a Schottky barrier diode 33 positioned in series to each other in the discharge path 31. A collector of the protective bipolar transistor 32 is connected to abase B of the Darlington transistor 20, and an emitter of the protective bipolar transistor 32 is connected through the Schottky barrier diode 33 to the emitter E of the Darlington transistor 20. The Schottky barrier diode 33 is provided in such a directional arrangement that its forward current is forward collector current of the protective bipolar transistor 32. A base of the protective bipolar transistor 32 is connected through a resistance 34 to a base BX of a transistor 21d at a final stage of the Darlington transistor 20.

<Circuit Operation>

An operation of the circuit in this embodiment will now be described. As collector current $I_C$ is increased because of short-circuit of a load (not shown) connected to a collector C of the Darlington transistor 20, base-emitter forward voltage $V_{BXE}$ of the transistor 21d is raised, as shown in a graph of FIG. 3. When the base-emitter forward voltage $V_{BXE}$ becomes higher than the sum of forward threshold voltage of the Schottky barrier diode 33 and base-emitter forward voltage of the bipolar transistor 32, the bipolar transistor 32 turns on. When the bipolar transistor 32 turns on, base current $I_B$ of the Darlington transistor 20 is bypassed to the emitter E of the Darlington transistor 20 via the discharge path 31, protective bipolar transistor 32 and Schottky barrier diode 33. Consequently, base current supplied to abase of a transistor 21a at an initial stage is restricted, and therefore, further increase in the collector current $I_C$ is suppressed.

Selecting and using the Schottky barrier diode 33 having an appropriate level of forward threshold voltage, the upper limit value of the collector current $I_C$ can be set to any level as required. If a manufacturing method is properly changed, the Schottky barrier diode 33 can be obtained having a variety of levels of the forward threshold voltage.

By virtue of the Schottky barrier diode 33, the Darlington transistor 20 can be applied to an inverter in addition to setting the upper limit value of the collector current $I_C$ to any level; that is, collector current in the reverse direction of the bipolar transistor 32 is blocked by the Schottky barrier diode 33 when the reverse bias voltage is applied between the base B and emitter E of the Darlington transistor. This prevents residual electric charge from being accumulated in the Darlington transistor 20 down, and therefore, the Darlington transistor 20 is not broken by redoubling the residual electric charge therein. Hence, the circuit of this embodiment can be applied to an inverter.

Moreover, since no resistance is connected in parallel between the base B and emitter E of the Darlington transistor 20 in the circuit of this embodiment, power required to drive the Darlington transistor 20 can be lowered, and a drive circuit can be fabricated at reduced price. Additionally, there is an advantage that there is no extra power loss because it is needless providing a resistance in a path of the corrector current $I_C$ in the Darlington transistor 20.

<Measured Data on the Circuit Characteristic>

Figure 4:
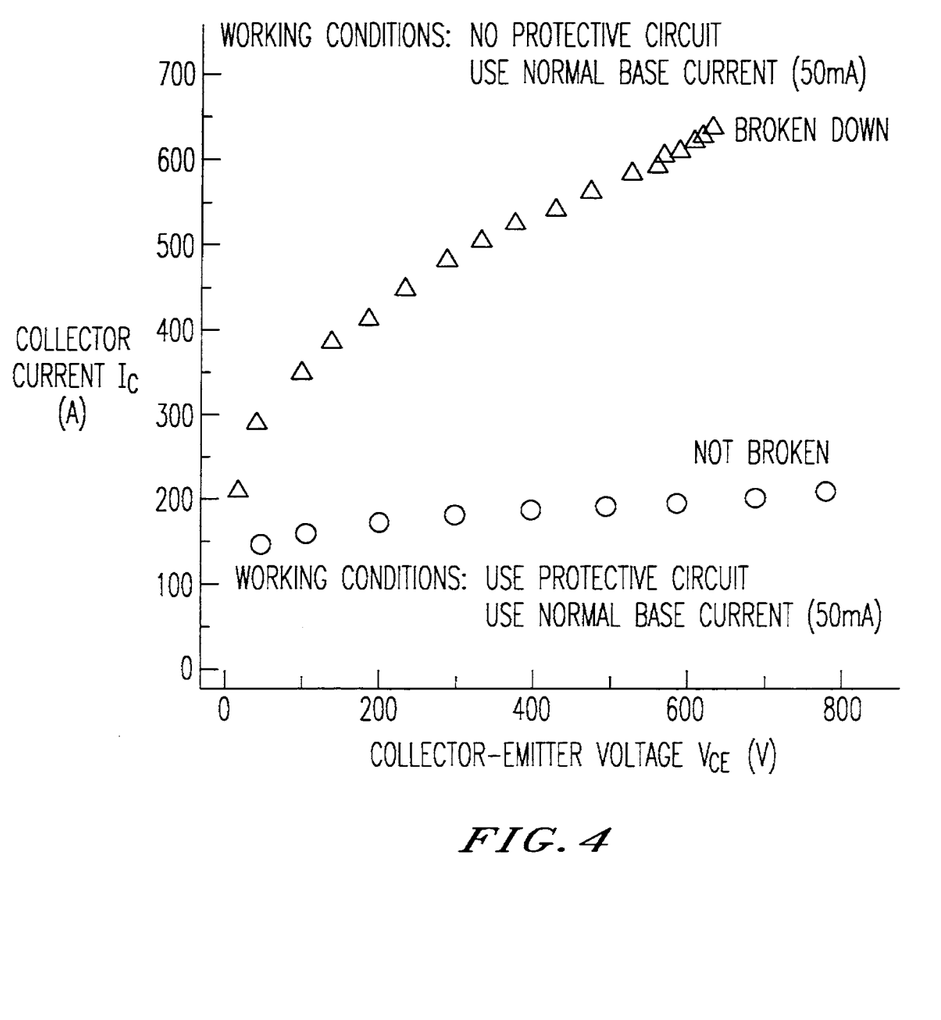
FIG. 4 is a graph showing data of practical measurement related to the circuit in FIG. 1.

FIG. 4 is a graph showing measured data obtained by conducting a test for proving the characteristic of the circuit shown in FIG. 1. The test includes a procedure that voltage $V_{CE}$ between the collector C and emitter E is raised stepwise under the condition of a flow of the base current $I_B$ of a constant level (50 mA) corresponding to the condition in ordinary use, and thereafter the collector current $I_C$ related to the varied collector-emitter voltage $V_{CE}$, in each of cases where a tested circuit includes the short-circuit protective circuit 30 and not.

In the case where the tested circuit does not include the short-circuit protective circuit 30, as shown in FIG. 4, the collector current $I_C$ infinitely rises as the collector-emitter voltage $V_{CE}$ rises, and at a point of $V_{CE}$=640 V the collector current $I_C$ of 640 A flows, which eventually causes the Darlington transistor 20 to be broken down. On the other hand, in the case where the tested circuit includes the short-circuit protective circuit 30, the collector current $I_C$ is controlled not to be at more than a certain level (about 200 A) even if the collector-emitter voltage $V_{CE}$ rises. Thus, even if the collector-emitter voltage $V_{CE}$ reaches 780 V, the Darlington transistor 20 are not broken down.

Although FIG. 4 shows the data obtained by the test under the ambient temperature, the collector current $I_C$ can also be controlled so as not to be over a level almost identical to the above-mentioned level in a trial under high temperature of 125° C. (not shown). It is proved that the short-circuit protective circuit 30 effectively operates over the whole rage of working temperature in the circuit of this embodiment and that the characteristic of the circuit does not rely upon the temperature so much, as has been described.

[3. Second Embodiment]

<Circuit Architecture>

Figure 5:
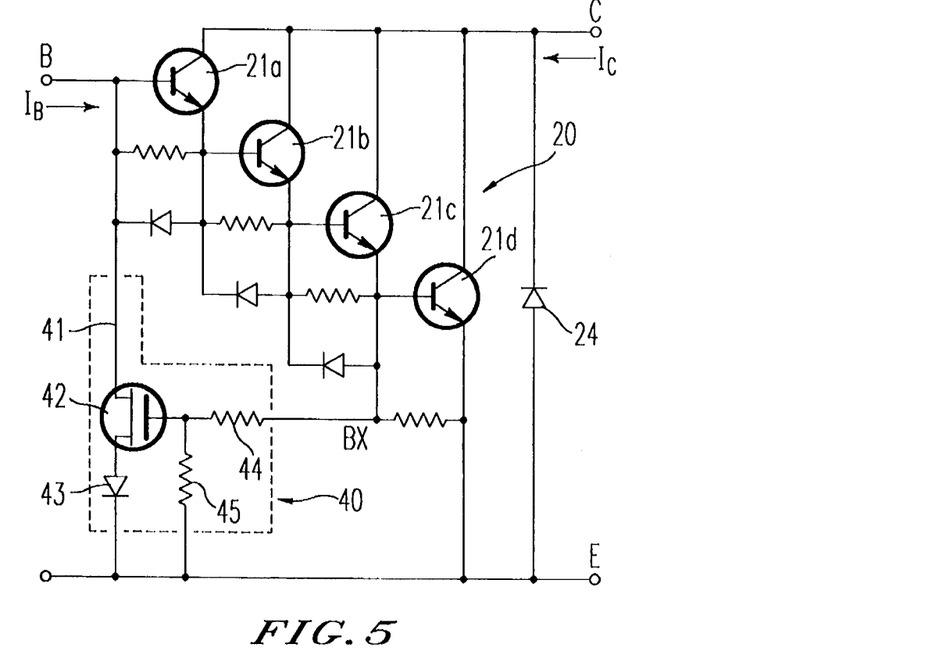
FIG. 5 is a circuit diagram showing a second preferred embodiment of the present invention.

FIG. 5 is a circuit diagram showing a second preferred embodiment of the present invention. This embodiment is a power Darlington transistor module where a short-circuit protective circuit 40 is incorporated in a Darlington transistor 20 as shown in FIG. 2. The short-circuit protective circuit 40 is provided with a discharge path 41 connecting a base B and emitter E of the Darlington transistor 20 with a protective MOSFET 42 and diode 43 in series to each other positioned in the discharge path 41. The protective MOSFET 42 has its drain connected to the base B of the Darlington transistor 20 and its source connected to the emitter E of the Darlington transistor 20 through the diode 43. The diode 43 is in such a directional arrangement that its forward current is forward drain current of the protective MOSFET 42. The protective MOSFET 42 has its gate connected to a base BX of a transistor 21d at a final stage of the Darlington transistor 20 through a resistance 44. A resistance 45 is also connected in parallel between the gate of the protective MOSFET 42 and the emitter E of the Darlington transistor 20.

<Circuit Operation>

An operation of a circuit of this embodiment will be described. When collector current $I_C$ of the Darlington transistor is increased, and accordingly, base-emitter forward voltage $V_{BXE}$ of the transistor 21d is at a level of or higher than the sum of forward threshold voltage of the diode 43 and gate-source threshold voltage of the MOSFET 42, the MOSFET 42 turns on. When the MOSFET 42 turns on, base current $I_B$ of the Darlington transistor 20 is bypassed to the emitter E of the Darlington transistor 20 through the discharge path 41, MOSFET 42, and diode 43. As a result, base current supplied to a base of a transistor 21a at an initial stage of the Darlington transistor 20 is restricted, and therefore, further increase in the collector current $I_C$ is suppressed.

A concentration of a channel region of the MOSFET 42 and a thickness of a gate oxide film are adjusted to appropriately set gate-source threshold voltage, or otherwise, the diode 43 having an appropriate forward threshold voltage is selectively used, so that the upper limit value of the collector current $I_C$ can be set to any level as required. For the diode 43, for example, a Schottky barrier diode can be used.

The diode 43 functions to prevent residual electric charge in the Darlington transistor 20 from being doubled to eventually breaking the Darlington transistor 20 down, similar to the Schottky barrier diode 33 in the first preferred embodiment. Thus, the circuit of this embodiment can be applied to an inverter.

Further in the circuit of this embodiment, since no resistance is connected in parallel between the base B and emitter E of the Darlington transistor, power required to drive the Darlington transistor 20 can be reduced, and a drive circuit can be fabricated at reduced cost, as in the circuit of the first preferred embodiment. Moreover, it is needless providing a resistance in the path of the collector current $I_C$ of the Darlington transistor 20, and therefore, there is an advantage that there is no extra power loss.

[4. Third Embodiment]

<Circuit Architecture>

Figure 6:
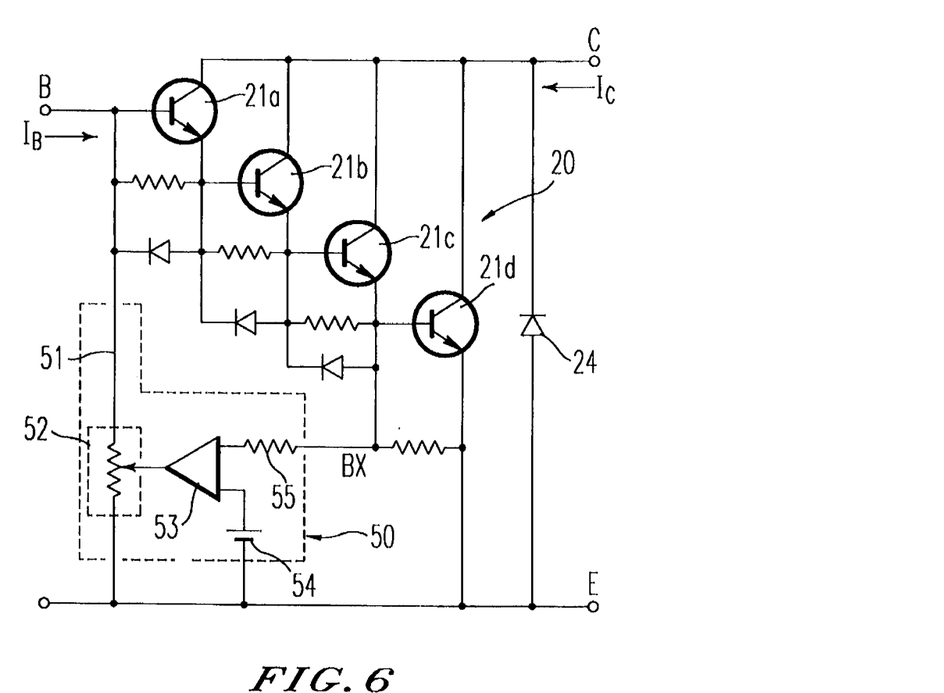
FIG. 6 is a circuit diagram showing a third preferred embodiment of the present invention.

FIG. 6 a circuit diagram showing a third preferred embodiment of the present invention. This embodiment is a power Darlington transistor module where a short-circuit protective circuit 50 is incorporated in the Darlington transistor 20 as shown in FIG. 2. The short-circuit protective circuit 50 is includes with a discharge path 51 connecting a base B and emitter E of the Darlington transistor 20. The protection circuit also includes an impedance transformer 52 positioned in the discharge path 51 with a variable impedance. The impedance transformer 52 receives an output signal from a comparator 53 to control the size of the impedance. The comparator 53 has its one of input terminals connected through a resistance 55 to abase BX of a transistor 21d and receives reference voltage from a reference power supply (reference voltage generating means) 54 on its second one of the input terminals. The short-circuit protective circuit 50 is formed of an integrated circuit.

<Circuit Operation>

Now, an operation of the circuit of this embodiment will be described. The comparator 53 compares base-emitter forward voltage $V_{BXE}$ of the transistor 21d with the reference voltage from the reference power supply 54. When the collector current $I_C$ of the Darlington transistor 20 is increased and accordingly the base-emitter forward voltage $V_{BXE}$ of the transistor 21d is at the level of the reference voltage or over, the comparator 53 transmits a specified signal to the impedance transformer 52. Based upon the signal, the impedance transformer 52 reduces an impedance of the discharge path 51, or an impedance between the base B and emitter E of the Darlington transistor 20. When the impedance is reduced, base current $I_B$ of the Darlington transistor 20 is bypassed to the emitter E of the Darlington transistor 20 through the discharge path 51 and impedance transformer 52. As a result, base current supplied to a base of a transistor 21a at an initial stage of the Darlington transistor 20 is restricted, and therefore, further increase in the collector current $I_C$ is suppressed.

Appropriately setting the level of the reference voltage applied by the reference power supply 54 as required, the upper limit value of the collector current $I_C$ can be set to any level as required. In the circuit of this embodiment, moreover, it is needless providing a resistance in the path of the collector current $I_C$ in the Darlington transistor 20, and therefore, there is an advantage that there is no extra power loss.

The circuit of the first preferred embodiment has a disadvantage that the base current $I_B$ bypassed by the bipolar transistor 32 is restricted in accordance with a current capacity and current amplification factor of the bipolar transistor 32 and that the circuit cannot be applied to a Darlington transistor of a reduced number of stages unless the current capacity and current amplification factor are considerably large. In the circuit of this embodiment, however, a mechanism for amplifying a difference between the reference voltage and base-emitter forward voltage $V_{BXE}$ can be integrated. Hence, the above-mentioned restriction can be removed according to a circuit design this embodiment, and there is an advantage that the circuit design of this embodiment can be applied to the Darlington transistor of the reduced number of stages.

[5. Variations]

Figure 7:
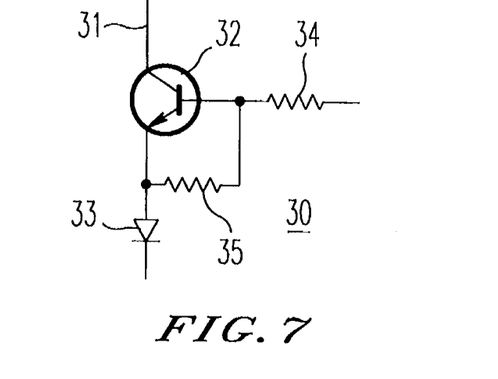
FIG. 7 is a circuit diagram showing a variation of the first preferred embodiment of the present invention.

(1) As shown in FIG. 7, in the first preferred embodiment, the resistance 35 can be connected between the base and the emitter of the bipolar transistor 32, and thereby an oscillation of the bipolar transistor 32 can be prevented. In such a case, the collector current in the reverse direction of the bipolar transistor does not flow, and therefore, the Darlington transistor 20 never be broken down by doubling residual electric charge therein.

(2) The present invention can be applied to Darlington transistors of various numbers of stages as well as the Darlington transistor 20 where transistors are arranged in four stages.

Figure 13:
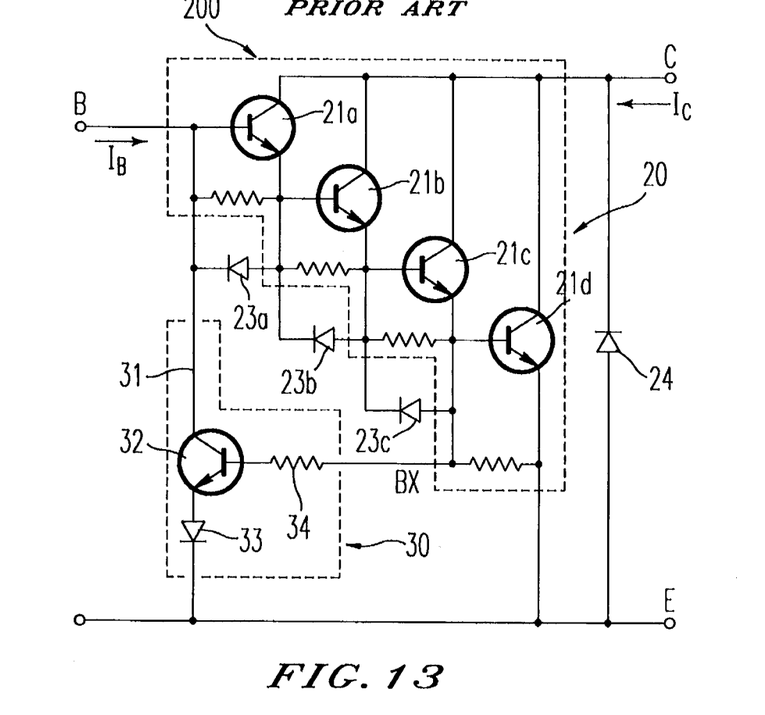
FIG. 13 is a circuit diagram showing a modification.

(3) The Darlington transistor 20 may be provided as an integrated circuit in one semiconductor chip. FIG. 13 is a circuit diagram showing an example where the Darlington transistor 20 is provided as an integrated circuit in the power Darlington transistor module of the first preferred embodiment which is shown in FIG. 1. In FIG. 13, a circuit portion 200 enclosed by the dotted line is integrated as one chip. Here, the integrated circuit 200 comprises transistors 21a to 21d and resistors which are interposed parallel between the bases and the emitters of the transistors 21a to 21d. By integrating these circuit elements in the form of an integrated circuit, a power Darlington transistor module having unvaried characteristics and an enhanced reliability is fabricated in a simplified manner. To form the module, all circuit elements are provided in one package, i.e., the integrated circuit 200, the speed-up diodes 23a to 23c, the free wheel diode 24, the bipolar transistor 32, the Schottky barrier diode 33 and the resistor 34.

Figure 14:
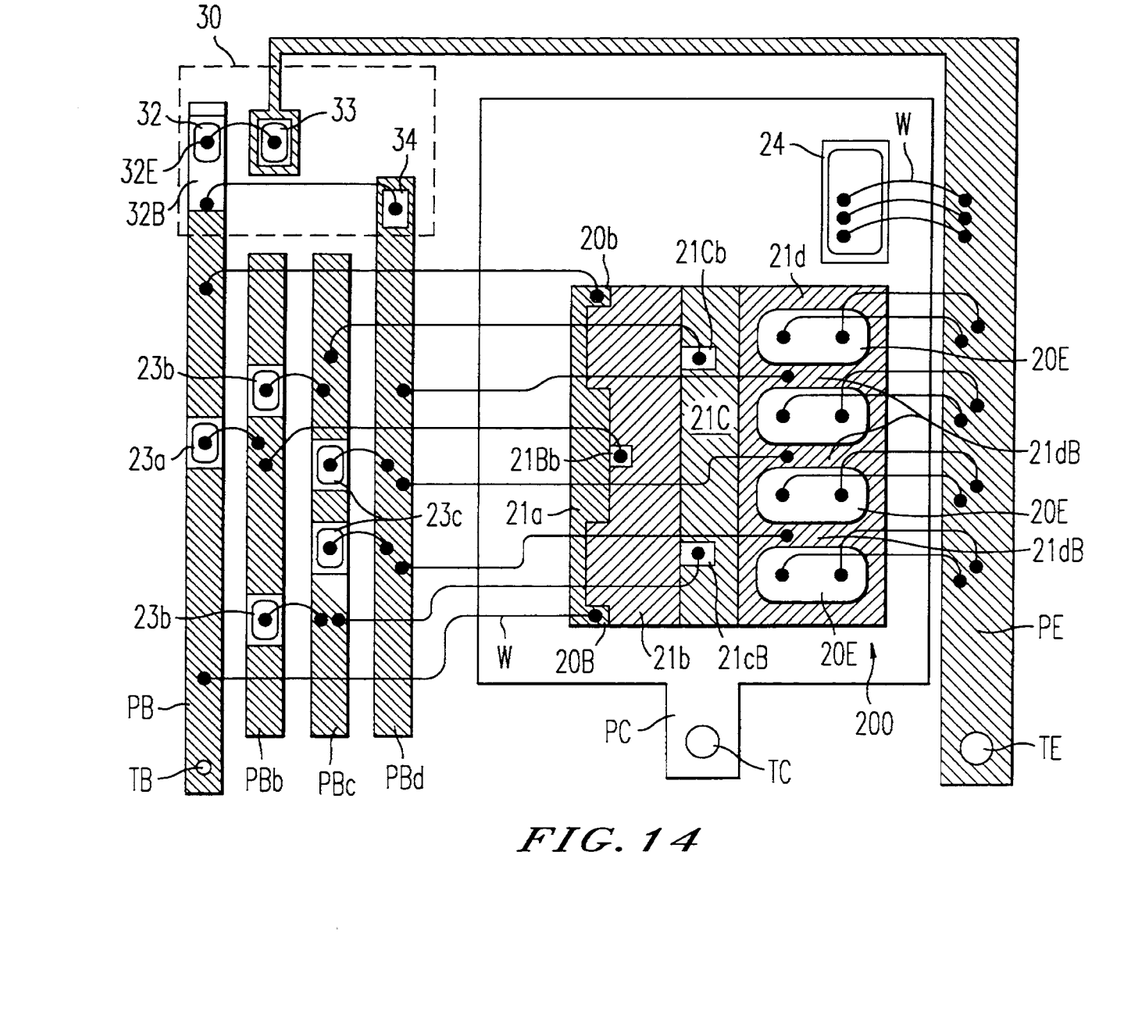
FIG. 14 is a plan view of a circuit board according to the modification.

FIG. 14 is a plan view of a circuit board of the power Darlington transistor module of FIG. 13, and shows the arrangement of the circuit elements and the wiring pattern in the module. Wiring patterns formed on the circuit board are: a collector wiring pattern PC which is connected to the collector C of the Darlington transistor 20; an emitter wiring pattern PE which is connected to the emitter E through a connecting wire W; a base wiring pattern PB which is connected to the base B through the connecting wire W; and base wiring patterns PBb to PBd which are connected to the bases of the transistors 21b to 21d through the connecting wire W. The wiring patterns PE, PC and PB are connected to terminals TE, TC and TB, respectively. The terminals TE and TC and one end of the terminal TB (not shown) are exposed external to the module for electrical connection to an external device.

The Schottky barrier diode 33 is mounted on the emitter wiring pattern PE. On the collector wiring pattern PC, the integrated circuit 200 which is integrated in the form of one chip and the free wheel diode 24 are seated. On the base wiring pattern PB, the bipolar transistor 32 and the speed-up diode 23a are mounted. A pair of speed-up diodes 23b, 23b is disposed on the base wiring pattern PBb while a pair of speed-up diodes 23c, 23c is disposed on the base wiring pattern PBc. The base wiring pattern PBc also mounts the resistor 34.

The connecting wire W is made of aluminum, for example, and electrically connects the circuit elements and the wiring patterns where necessary. That is, by means of the connecting wire W, the emitter 32E of the bipolar transistor 32 and the anode electrode of the Schottky barrier diode 33 are connected to each other, the base 32B of the bipolar transistor 32 and the resistor 34 are connected to each other, the anode electrode of the speed-up diode 23a and the base wiring pattern PBb are connected to each other, the anode electrode of the speed-up diode 23b and the base wiring pattern PBc are connected to each other, the anode electrode of the speed-up diode 23c and the base wiring pattern PBd are connected to each other, the base wiring pattern PB and the base 20B of the integrated circuit 200 are connected to each other, the base wiring pattern PBb and the base 21bB of the transistor 21b are connected to each other, the base wiring pattern PBc and the base 21cB of the transistor 21c are connected to each other, the base wiring pattern PBd and the base 21dB of the transistor 21d are connected to each other, the emitter 20E of the integrated circuit 200 and the emitter wiring pattern PE are connected to each other, and the anode electrode of the free wheel diode 24 and the emitter wiring pattern PE are connected to each other.

As shown in FIG. 14, the circuit elements and the wiring patterns are located so as to minimize the length of the connecting wire W. In addition, the collector wiring pattern PC is formed larger than the integrated circuit 200 so that heat generated in the integrated circuit 200 is transferred as effectively as possible to a heat radiating plate (which is bonded to the back surface of the board; not shown). In other words, the collector wiring pattern PC mounting the integrated circuit 200 functions not only as a path for carrying a main current which flows through the integrated circuit 200 but also as a path for transferring heat which is developed in the integrated circuit 200 for heat radiation.

As understood from FIG. 14, only by mounting the one chip integrated circuit 200 on the collector wiring pattern PC, the Darlington transistor 20 and the associated base-emitter resistors are incorporated in the module. Hence, as compared with where the transistors 21a to 21d are independently mounted, the module is fabricated much easier.

While the invention has been shown and described in detail, the foregoing description is in all aspects illustrative and not restrictive. It is therefore understood that numerous modifications and variations can be devised without departing from the scope of the invention.

What is claimed is:

1. A circuit for protecting a power Darlington transistor from a short-circuit, said Darlington transistor having a plurality of transistors arranged in stages, comprising:

a discharge path connecting a base at an initial stage of said Darlington transistor and an emitter at a final stage of said Darlington transistor so as to electrically connect the base and the emitter;

a transistor provided in said discharge path to place the discharge path in conductive state when a potential difference between a base and the emitter at the final stage of said Darlington transistor equals a specified level, one terminal of said transistor being connected to a point between said base and said emitter at the final stage of said Darlington transistor through a resistor; and a Schottky barrier diode provided in said discharge path between a second terminal of said transistor and the emitter at the final stage of the Darlington transistor, which is directly connected to an external emitter terminal of the Darlington transistor, so that the forward current of the diode is the forward current of the second terminal of said transistor.

* * * * *